US006819028B2

(12) United States Patent
Takatsuka et al.

(10) Patent No.: US 6,819,028 B2
(45) Date of Patent: Nov. 16, 2004

(54) METHOD FOR SELECTING PIEZOELECTRIC TRANSFORMER CHARACTERISTIC

(75) Inventors: Akiteru Takatsuka, Otsu (JP); Takaaki Asada, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/811,660

(22) Filed: Mar. 19, 2001

(65) Prior Publication Data
US 2002/0135271 A1 Sep. 26, 2002

(30) Foreign Application Priority Data
Mar. 21, 2000 (JP) ........................................ 2000-079027

(51) Int. Cl.[7] .......................................... H01L 41/107
(52) U.S. Cl. ................................................ 310/318
(58) Field of Search ................................. 310/318, 317

(56) References Cited

U.S. PATENT DOCUMENTS

| | | | | | |
|---|---|---|---|---|---|
| 3,778,648 | A | * | 12/1973 | Kawada ...................... | 310/318 |
| 5,371,430 | A | * | 12/1994 | Sato et al. .................. | 310/359 |
| 5,424,602 | A | * | 6/1995 | Sato et al. .................. | 310/359 |
| 5,757,104 | A | * | 5/1998 | Getman et al. ............. | 310/317 |
| 6,078,124 | A | * | 6/2000 | Furuhashi et al. .......... | 310/318 |
| 6,269,326 | B1 | * | 7/2001 | Lejeune ........................ | 703/2 |
| 6,281,676 | B1 | * | 8/2001 | Ottesen et al. .............. | 324/212 |
| 6,348,755 | B1 | * | 2/2002 | Shimamura et al. ........ | 310/318 |
| 6,495,947 | B1 | * | 12/2002 | Kim et al. ................... | 310/358 |

FOREIGN PATENT DOCUMENTS

| | | | | | |
|---|---|---|---|---|---|
| JP | 5-176530 | * | 7/1993 | ......... | H01L/41/107 |
| JP | 6-310775 | * | 11/1994 | ......... | H01L/41/107 |
| JP | 9-33334 | * | 2/1997 | ......... | G01H/15/00 |
| JP | 11-271370 | * | 10/1999 | ......... | G01R/29/22 |
| JP | 2000-216450 | * | 8/2000 | ......... | H01L/41/07 |

* cited by examiner

Primary Examiner—Thomas M. Dougherty
(74) Attorney, Agent, or Firm—Keating & Bennett, LLP (57) ABSTRACT

A method for selecting a piezoelectric transformer characteristic includes the steps of connecting a primary-side driving section of a piezoelectric transformer to a high-frequency generator while leaving a secondary-side generating section thereof in an open state, causing the high-frequency generator to sequentially generate and sweep a high-frequency signal over a predetermined frequency range, measuring a resonant frequency of an input-impedance-versus-frequency characteristic of the piezoelectric transformer, and selecting the characteristic of the piezoelectric transformer based on the value of the measured resonant frequency.

24 Claims, 7 Drawing Sheets

METHOD FOR SELECTING PIEZOELECTRIC TRANSFORMER CHARACTERISTIC

BACKGROUND OF THE INVENTION

1. Field of the Invention

The present invention relates to methods for selecting piezoelectric transformer characteristics, and more particularly, the present invention relates to a method for selecting a characteristic of a piezoelectric transformer which is used, for example, as a driving power source of a backlight inverter of a liquid crystal display, a camera flash device, or suitable devices.

2. Description of the Related Art

A Rosen-type piezoelectric transformer is one of the generally known piezoelectric transformers. This piezoelectric transformer includes a piezoelectric body unit which is formed by laminating ceramic sheets made of a piezoelectric ceramic material such as lead zirconium titanate (PZT) and then baking the laminated sheets. The piezoelectric body unit includes a driving unit (primary side) and a generating unit (secondary side).

There are three factors that determine the efficiency and the step-up ratio of the piezoelectric transformer having the above construction: the polarizability of the primary side, the polarizability of the secondary side, and the internal electrode film thickness of the primary side. Here, the polarizability is a proportion of the amount of polarization in which the amount of polarization in a saturation state is 1 (=100%). When these polarizabilities and the internal electrode film thickness are desired to be examined, the primary side and the secondary side of the piezoelectric transformer must be separately cut into test pieces to determine the electromechanical coupling factors thereof. However, since the piezoelectric transformer cannot be destroyed during a shipping inspection in a mass-production process, this method cannot be used. Accordingly, conventionally, defective or non-defective piezoelectric transformers are selected based on evaluations of an efficiency-versus-frequency characteristic and a step-up-ratio-versus-frequency characteristic.

However, when the efficiency-versus-frequency characteristic or the step-up-ratio-versus-frequency characteristic is evaluated to select the piezoelectric transformer, the characteristic must be evaluated in a state in which the primary side and the secondary side of the piezoelectric transformer are electrically connected. Particularly, a connection which is secure and which also allows the great number of possible vibrations is required for the secondary side which exhibits a high level of vibration. Therefore, it is difficult to evaluate the piezoelectric transformer in an isolated state before it is mounted on a substrate, in a casing, or other such substrate. In most cases, when the piezoelectric transformer is evaluated, it is mounted on the substrate or in an inverter circuit. In addition, since use of this method is time-consuming, it is unproductive to perform selection of the characteristic using this method during the mass-production process.

SUMMARY OF THE INVENTION

In order to overcome the problems described above, preferred embodiments of the present invention provide a method for selecting a piezoelectric transformer characteristic in which the piezoelectric transformer can be evaluated in an isolated state and the selecting time can be reduced.

According to a first preferred embodiment of the present invention, a method for selecting a piezoelectric transformer characteristic includes the steps of connecting a primary-side driving section of a piezoelectric transformer to a high-frequency generator while leaving a secondary-side generating section thereof in an open state, causing the high-frequency generator to sequentially generate and sweep a high-frequency signal over a predetermined frequency range, measuring a resonant frequency fr of an input-impedance-versus-frequency characteristic of the piezoelectric transformer, and selecting the characteristic of the piezoelectric transformer based on the value of the measured resonant frequency fr.

According to a second preferred embodiment of the present invention, a method for selecting a piezoelectric transformer characteristic includes the steps of connecting a primary-side driving section of a piezoelectric transformer to a high-frequency generator while leaving a secondary-side generating section thereof in an open state, causing the high-frequency generator to sequentially generate and sweep a high-frequency signal over a predetermined frequency range, measuring a bandwidth of an input-impedance-versus-frequency characteristic of the piezoelectric transformer in which the bandwidth is determined by subtracting a resonant-frequency fr from an antiresonant-frequency fa, and selecting the characteristic of the piezoelectric transformer based on the value of the measured bandwidth.

According to a third preferred embodiment of the present invention, a method for selecting a piezoelectric transformer characteristic includes the steps of connecting a primary-side driving section of a piezoelectric transformer to a high-frequency generator while leaving a secondary-side generating section thereof in an open state, causing the high-frequency generator to sequentially generate and sweep a high-frequency signal over a predetermined frequency range, measuring a resonant resistance Zr from an input-impedance-versus-frequency characteristic of the piezoelectric transformer, and selecting the characteristic of the piezoelectric transformer based on the value of the measured resonant resistance Zr.

According to a fourth preferred embodiment of the present invention, a method for selecting a piezoelectric transformer characteristic includes the steps of connecting a primary-side driving section of a piezoelectric transformer to a high-frequency generator while leaving a secondary-side generating section thereof in an open state, causing the high-frequency generator to sequentially generate and sweep a high-frequency signal over a predetermined frequency range, measuring a resonant frequency fr, a bandwidth, and a resonant resistance Zr from an input-impedance-versus-frequency characteristic of the piezoelectric transformer in which the bandwidth is determined by subtracting a resonant-frequency fr from an antiresonant-frequency fa, and selecting the characteristic of the piezoelectric transformer based on the values of the measured resonant frequency fr, the bandwidth, and the resonant resistance Zr.

According to a fifth preferred embodiment of the present invention, a method for selecting a piezoelectric transformer characteristic includes the steps of connecting a primary-side driving section of a piezoelectric transformer to a high-frequency generator while leaving a secondary-side generating section thereof short-circuited, causing the high-frequency generator to sequentially generate and sweep a high-frequency signal over a predetermined frequency range, measuring a resonant frequency fr of an inputimpedance-versus-frequency characteristic of the piezoelectric transformer, and selecting the characteristic of the piezoelectric transformer based on the value of the measured resonant frequency fr.

According to a sixth preferred embodiment of the present invention, a method for selecting a piezoelectric transformer characteristic includes the steps of connecting a primary-side driving section of a piezoelectric transformer to a high-frequency generator while leaving a secondary-side generating section thereof short-circuited, causing the high-frequency generator to sequentially generate and sweep a high-frequency signal over a predetermined frequency range, measuring a bandwidth of an input-impedance-versus-frequency characteristic of the piezoelectric transformer in which the bandwidth is determined by subtracting a resonant-frequency fr from an antiresonant-frequency fa, and selecting the characteristic of the piezoelectric transformer based on the value of the measured bandwidth.

According to a seventh preferred embodiment of the present invention, a method for selecting a piezoelectric transformer characteristic includes the steps of connecting a primary-side driving section of a piezoelectric transformer to a high-frequency generator while leaving a secondary-side generating section thereof short-circuited, causing the high-frequency generator to sequentially generate and sweep a high-frequency signal over a predetermined frequency range, measuring a resonant resistance Zr of an input-impedance-versus-frequency-characteristic of the piezoelectric transformer, and the characteristic of the piezoelectric transformer based on the value of the measured resonant resistance Zr.

According to an eighth preferred embodiment of the present invention, a method for selecting a piezoelectric transformer characteristic includes the steps of connecting a primary-side driving section of a piezoelectric transformer to a high-frequency generator while leaving a secondary-side generating section thereof short-circuited, causing the high-frequency generator to sequentially generate and sweep a high-frequency signal over a predetermined frequency range, measuring a resonant frequency fr, a bandwidth, and a resonant resistance Zr of an input-impedance-versus-frequency characteristic of the piezoelectric transformer in which the bandwidth is determined by subtracting a resonant-frequency fr from an antiresonant-frequency fa, and selecting the characteristic of the piezoelectric transformer based on the values of the measured resonant frequency fr, the bandwidth, and the resonant resistance Zr.

The polarizability condition of the secondary-side generating section of the piezoelectric transformer can be examined by measuring the resonant frequency from the input-impedance-versus-frequency characteristic. The polarizability condition of the primary-side driving section of the piezoelectric transformer can be examined by measuring the bandwidth. The film thickness condition of internal electrodes of the primary-side driving section can be examined by measuring the resonant resistance. Therefore, instead of measuring the efficiency-versus-frequency characteristic or the step-up-ratio-versus-frequency-characteristic, by measuring the resonant frequency, the bandwidth, or the resonant resistance from the input-impedance-versus-frequency characteristic, the piezoelectric transformer having a predetermined characteristic can be selected. Since only the input-impedance characteristic of the piezoelectric transformer is measured, the measuring time is greatly reduced.

When the input-impedance-versus-frequency characteristic is measured in a case in which the secondary-side generating section of the piezoelectric transformer is in an open state, the piezoelectric transformer can be measured in an isolated state (that is, the transformer does not have to be mounted to a substrate or an inverter circuit). Therefore, even though the piezoelectric transformer that does not meet the selection criteria and standards is produced, only the piezoelectric transformer is wasted as a defective product, which is contrary to a conventional case in which the surface-mounting substrate or the casing provided with the defective piezoelectric transformer is also wasted. Therefore, significant cost savings are achieved with preferred embodiments of the present invention.

Other features, elements, steps, processes and advantages of the present invention will become apparent from the detailed description of preferred embodiments with reference to the attached drawings.

DETAILED DESCRIPTION OF PREFERRED EMBODIMENTS

Preferred embodiments of a method for selecting a piezoelectric transformer characteristic according to the present invention are described with reference to the attached drawings.

Figure 1:
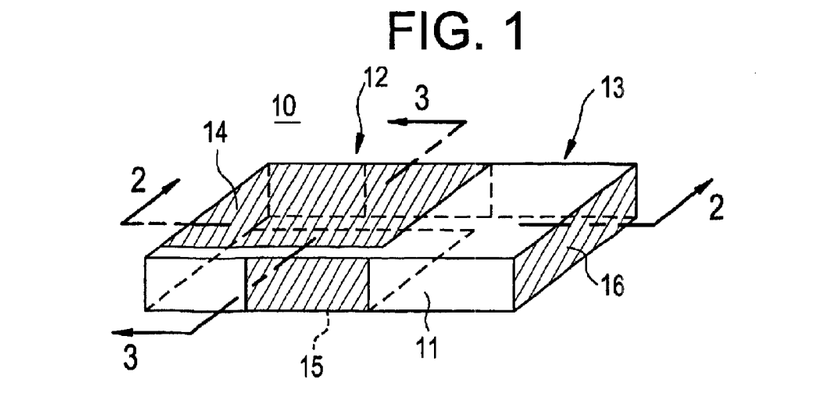
FIG. 1 is a perspective view showing one example of a piezoelectric transformer used in a method for selecting a piezoelectric transformer characteristic according to preferred embodiments of the present invention.

FIG. 1 shows one example of the piezoelectric transformer used in various preferred embodiments of the present invention. A piezoelectric transformer 10 includes a piezoelectric body unit 11 that includes a primary-side driving section 12 and a secondary-side generating section 13. The primary-side driving section 12 is substantially the left half of the piezoelectric body unit 11 and the secondary-side generating section 13 is substantially the right half of the piezoelectric body unit 11.

Figure 2:
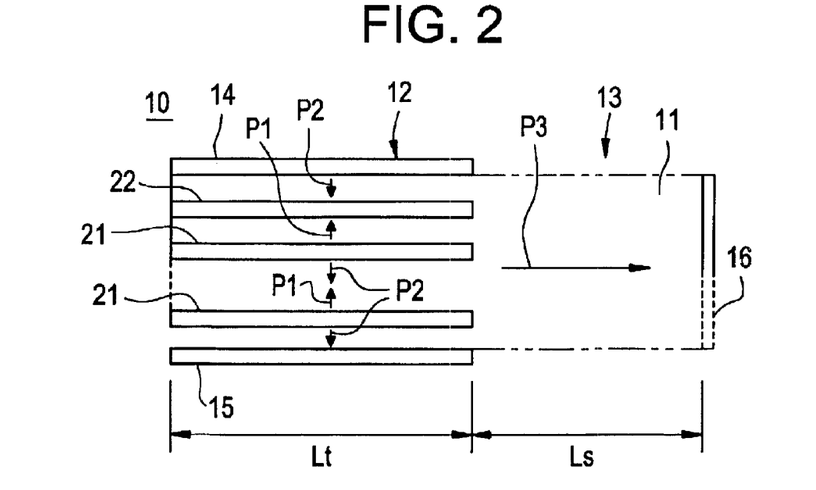
FIG. 2 is a cross-sectional view taken along line II—II in FIG. 1.
Figure 3:
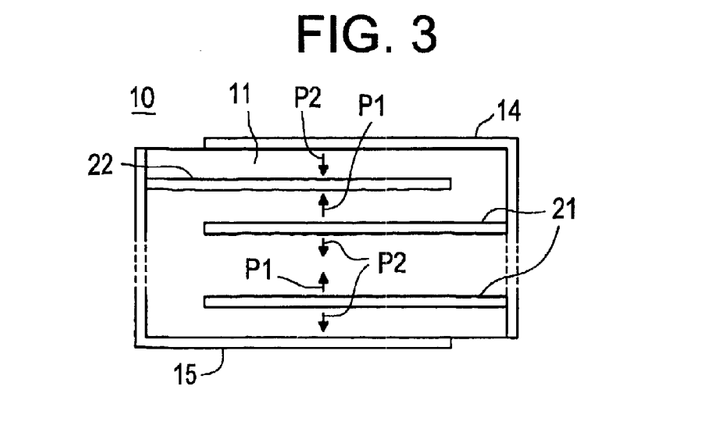
FIG. 3 is a cross-sectional view taken along line III—III in FIG. 1.

The piezoelectric transformer 10 is preferably a Rosen-type piezoelectric transformer. The piezoelectric body unit 11 is obtained by producing green sheets of ceramic material such as lead zirconium titanate (PZT) using a doctor blade method, forming hot-side internal electrodes 21 and a ground-side internal electrode 22, as shown in FIGS. 2 and 3, on the green sheets using a screen printing method or other suitable method, laminating and compression-bonding the green sheets, cutting the green sheets into substantially rectangular pieces, baking the sheets, and applying polarization processing thereto. As shown in FIGS. 1 to 3, an input external electrode 14, a ground external electrode 15, and an output external electrode 16 are formed on the piezoelectric body unit 11 using a silver firing method or other suitable process. The input external electrode 14 is electrically connected to the hot-side internal electrodes 21 and the ground external electrode 15 is electrically connected to the ground-side internal electrode 22.

When an alternating voltage that has the same frequency as the intrinsic resonant frequency of the piezoelectric unit 11 in the longitudinal direction is applied between the input external electrode 14 and the ground external electrode 15, the piezoelectric body unit 11 vibrates in a primary vibration mode in the longitudinal direction thereof. This produces electric charge due to the piezoelectric effect in the secondary-side generating section 13 as well as an output voltage across the output external electrode 16 and the ground external electrode 15.

Figure 4:
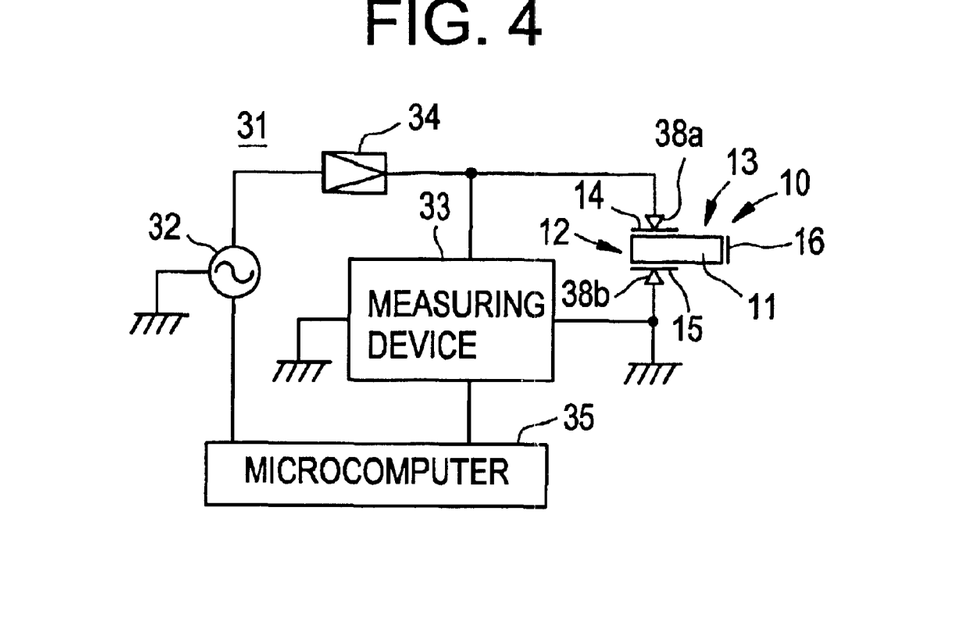
FIG. 4 is a block diagram showing one example of an input-impedance-versus-frequency characteristic measuring apparatus used in the method for selecting the piezoelectric transformer characteristic according to preferred embodiments of the present invention.

FIG. 4 shows a frequency-characteristic measuring apparatus 31. The frequency-characteristic measuring apparatus 31, which is specifically, for example, an impedance analyzer, includes a high frequency generator 32, a measuring device 33, an amplifier 34 for amplifying a high frequency signal from the high frequency generator 32, and a microcomputer 35 controlling the high frequency generator 32 and the measuring device 33.

The microcomputer 35 executes a series of measurements and data processing quickly in accordance with a software program pre-stored in a memory. That is, the high frequency generator 32 sweeps a high frequency signal over a predetermined frequency range and outputs it to the piezoelectric transformer 10 connected to measurement terminals 38a and 38b in accordance with a control signal from the microcomputer 35. The measuring device 33 measures input-impedance-versus-frequency characteristics of the piezoelectric transformer 10 over all of the predetermined frequencies. The measurement data is output to the microcomputer 35 where the data is processed.

In a first preferred embodiment of the present invention, a method for selecting a characteristic of the piezoelectric transformer 10 is described in which the characteristic of the piezoelectric transformer 10 is selected by setting the piezoelectric transformer 10 in the frequency-characteristic measuring apparatus 31 and then measuring a resonant frequency fr from an input-impedance-versus-frequency characteristic of the piezoelectric transformer 10.

Figure 5:
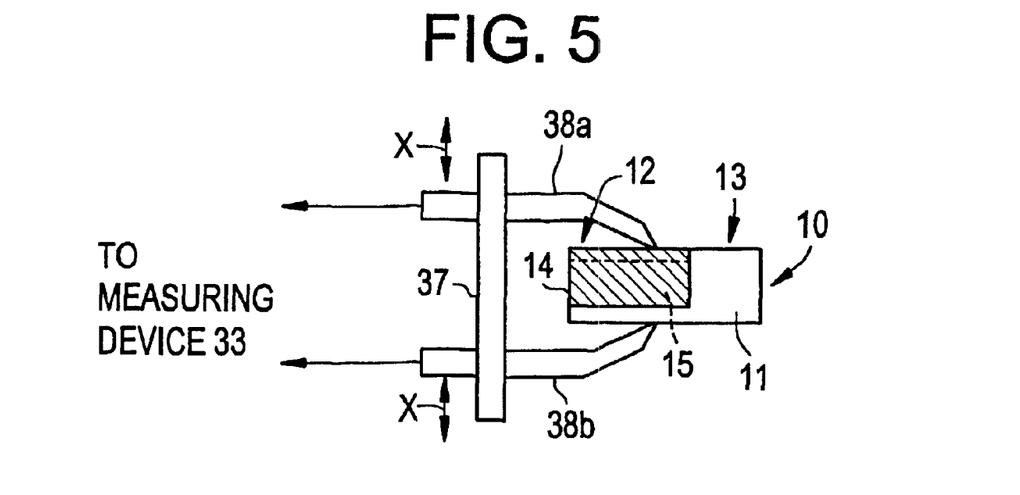
FIG. 5 is an enlarged view of measuring terminals of the input-impedance-versus-frequency characteristic measuring apparatus shown in FIG. 4.

As shown in FIG. 5, the measurement terminals 38a and 38b of the measuring apparatus 31 are preferably substantially claw-shaped. They are mounted to a base 37 in a moveable manner in the direction of an arrow X. The primary-side driving section 12 is held by the measurement terminals 38a and 38b which are electrically connected to the input external electrode 14 and the ground external electrode 15, respectively. On the other hand, the secondary-side generating section 13 of the piezoelectric transformer 10 (in other words, the output external electrode 16) is in an open state.

A plurality of samples of the piezoelectric transformer 10, e.g. samples S1, S2, and S3, each has eight laminated ceramic green sheets, approximate dimensions of 30 mm in length, 6 mm in width, and 1.4 mm in thickness, and a ratio of about 6:4 of the length $L_t$ of the driving section 12 to the length $L_s$ of the generating section 13. In these samples S1 to S3, the polarizabilities of the driving section 12 are 100%. In the sample S1, the polarizability of the generating section 13 is 63%; in sample S2, the polarizability is 83%; and in sample S3, the polarizability is 100%.

Figure 6A:
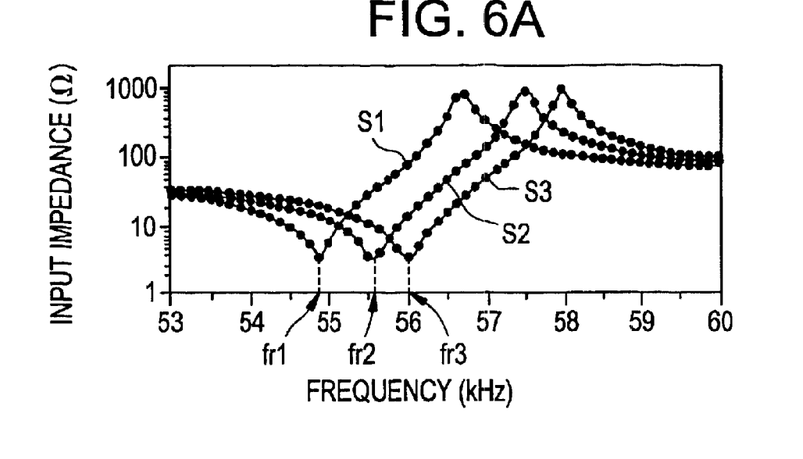
FIGS. 6A, 6B, and 6C are graphs indicating the input-impedance-versus-frequency characteristic, an efficiency-versus-frequency characteristic, and a step-up-ratio-versus-frequency characteristic, respectively, for illustrating the method for selecting the piezoelectric transformer characteristic according to a first preferred embodiment of the present invention.
Figure 6B:
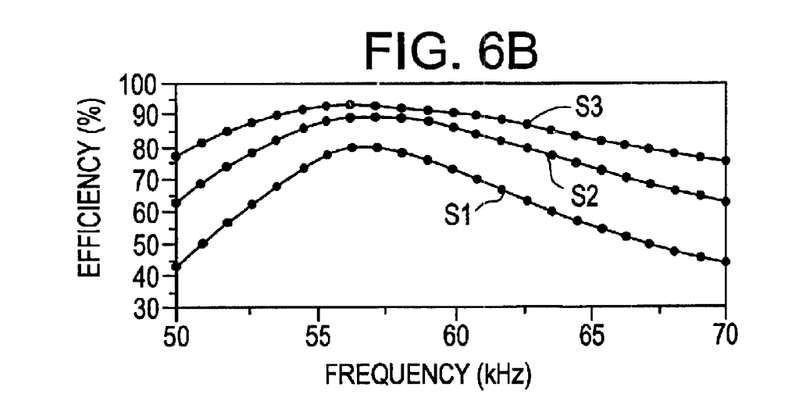
Figure 6C:
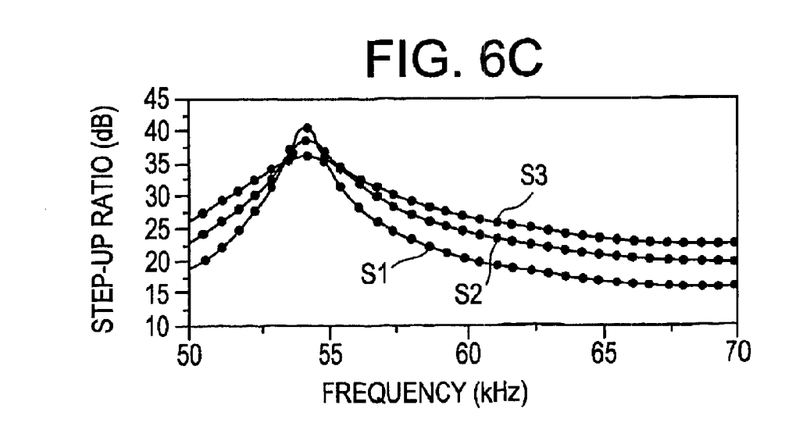

FIG. 6A shows the results obtained by measuring the impedance-versus-frequency characteristic of each of the samples S1 to S3 using the measuring apparatus 31. FIGS. 6B and 6C indicate the results obtained by measuring, using a measuring apparatus 40 shown in FIG. 7, an efficiency-versus-frequency characteristic and a step-up-ratio-versus-frequency characteristic, respectively, of each of the samples S1 to S3. In FIGS. 6A to 6C, solid lines S1 indicate the measurement results of the sample S1; solid lines S2 indicate the measurement results of the sample S2; and solid lines S3 indicate the measurement results of the sample S3.

Figure 7:
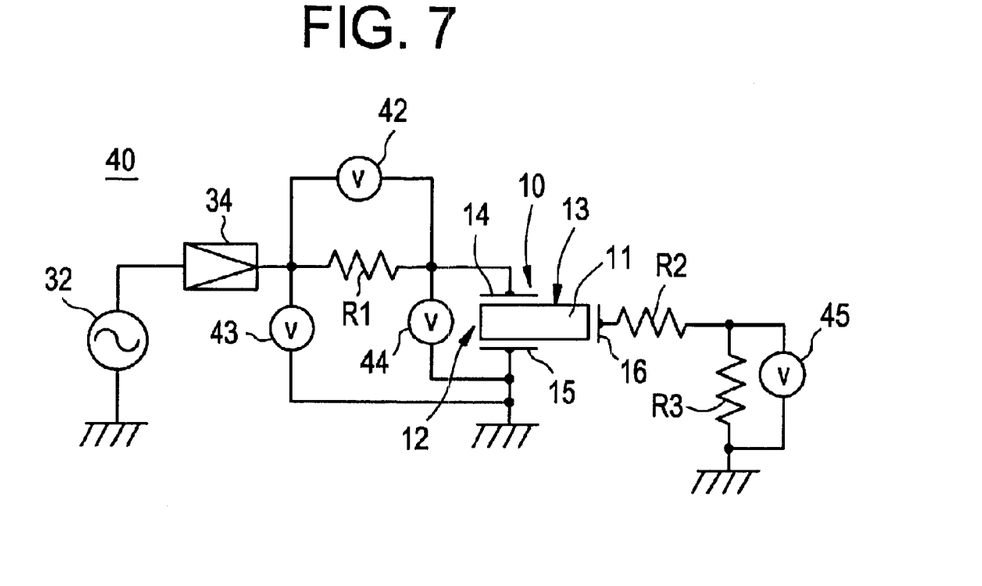
FIG. 7 is a block diagram showing one example of an apparatus measuring the efficiency-versus-frequency characteristic and the step-up-ratio-versus-frequency characteristic.

The measuring apparatus 40 makes use of a three voltmeter method, which has been well known. This measuring apparatus 40 includes the high frequency generator 32, the amplifier 34, three voltmeters 42, 43 and 44, a measurement resistor R1, a load resistor R2 (resistance value: 200 kΩ), a voltage-dividing resistor R3, and a voltmeter 45 for measuring the voltage across both ends of the voltage-dividing resistor R3.

FIG. 6A shows that the resonant frequency $f_r$ of the piezoelectric transformer 10 moves toward the lower frequency side in the order of $f_r3$, $f_r2$, and $f_r1$ in accordance with the decrease in the polarizability of the secondary-side generating section 13 (in other words, as the sample is varied in the order of S3, S2, and S1). FIG. 6B shows that the efficiency of the piezoelectric transformer 10 decreases in accordance with the decrease in the polarizability of the secondary-side generating section 13. FIG. 6C shows that the step-up ratios increase in the proximities of the corresponding resonant frequencies $f_r1$, $f_r2$, and $f_r3$ of the samples S1 to S3 while the step-up ratios decrease away from them.

Once the above relationships are established, the piezoelectric transformer 10 is selected as follows. For example, when the piezoelectric transformer 10 having an efficiency of about 80% or above at 60 kHz is desired to be selected, the above relationships show that the sample S1 (the polarizability of the driving section 12 is about 63%) does not meet the selecting standards while the sample S2 (the polarizability of the driving section 12 is about 83%) meets the standards (see FIG. 6B). When, for example, the piezoelectric transformer 10 having a step-up ratio of about 23 dB or above at 60 kHz is desired to be selected, the sample S1 does not meet the standards while the sample S2 meets the standards (see FIG. 6C). Accordingly, when the piezoelectric transformer 10 is selected, setting the resonant frequency $f_r2$ of the sample S2 as the lower limit in the input-impedance-versus-frequency characteristic shown in FIG. 6A enables the piezoelectric transformer 10 having an efficiency of about 80% or above and a step-up ratio of about 23 dB or above at 60 kHz to be selected without measuring the efficiency-versus-frequency characteristic or the step-up-ratio-versus-frequency characteristic. That is, the polarizability condition of the secondary-side generating section 13 can be confirmed by measuring the resonant frequency $f_r$ from the input-impedance-versus-frequency characteristic.

The upper limit of the resonant frequency $f_r$ from the input-impedance-versus-frequency characteristic may be when the polarizability of the generating section 13 is approximately 100% or may be determined in accordance with the driving frequency of the inverter circuit.

According to the above described method, the resonant frequency $f_r$ from the input-impedance-versus-frequency characteristic is measured using the measuring apparatus 31 shown in FIG. 4 and then the piezoelectric transformer 10 having a predetermined characteristic can be selected based on the measurement value of the resonant frequency $f_r$. In addition, when measurement is performed, the piezoelectric transformer 10 does not have to be mounted to a substrate, a casing, or other mounting surface. Therefore, even though the piezoelectric transformer 10 that does not meet the selection criteria is produced, only the piezoelectric transformer 10 is wasted as the defective product, which is contrary to the conventional case in which the surface-mounting substrate or the casing provided with the defective piezoelectric transformer 10 is also wasted. Therefore, significant cost savings are achieved.

Furthermore, measurement can be performed by simply evaluating the impedance characteristic of the input side (the driving section 12 side) of the piezoelectric transformer 10. This evaluation is performed by simply electrically connecting the claw-shaped measurement terminals 38a and 38b to the input external electrode 14 and the ground external electrode 15, respectively. Therefore, less measuring time is required.

Figure 8:
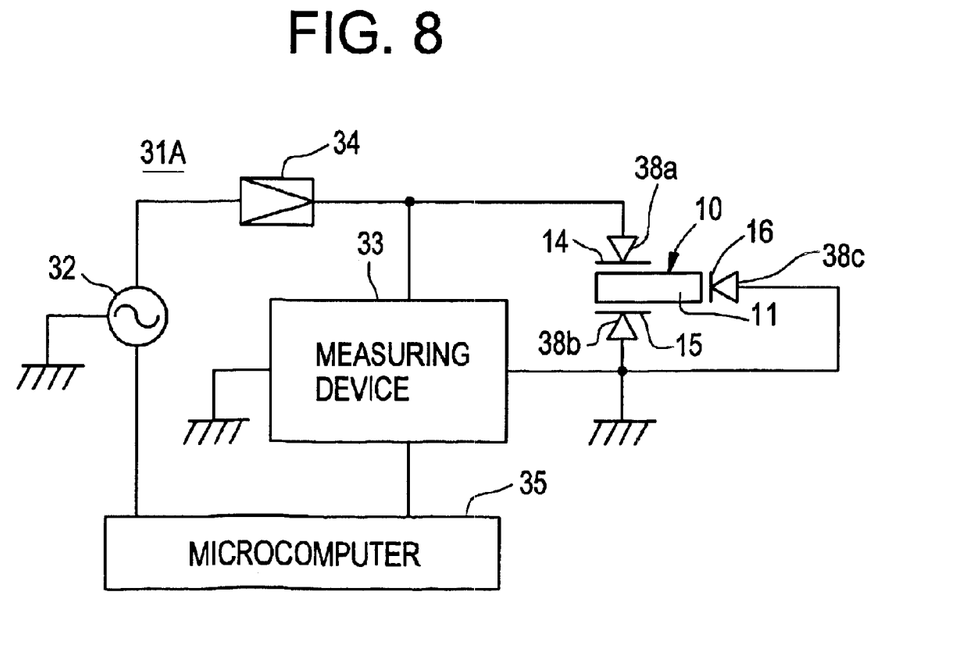
FIG. 8 is a block diagram showing one example of an input-impedance-versus-characteristic measuring apparatus used in a method for selecting the piezoelectric transformer characteristic according to a second preferred embodiment of the present invention.

In the second preferred embodiment of the present invention, a method for selecting a characteristic of the piezoelectric transformer 10 is described in which the characteristic of the piezoelectric transformer 10 is selected by measuring the resonant frequency $f_r$ from the input-impedance-versus-frequency characteristic while causing the measurement terminal 38c of the frequency-characteristic measuring apparatus 31A to short-circuit the secondary-side generating section 13 (in other words, the output external electrode 16).

Figure 9:
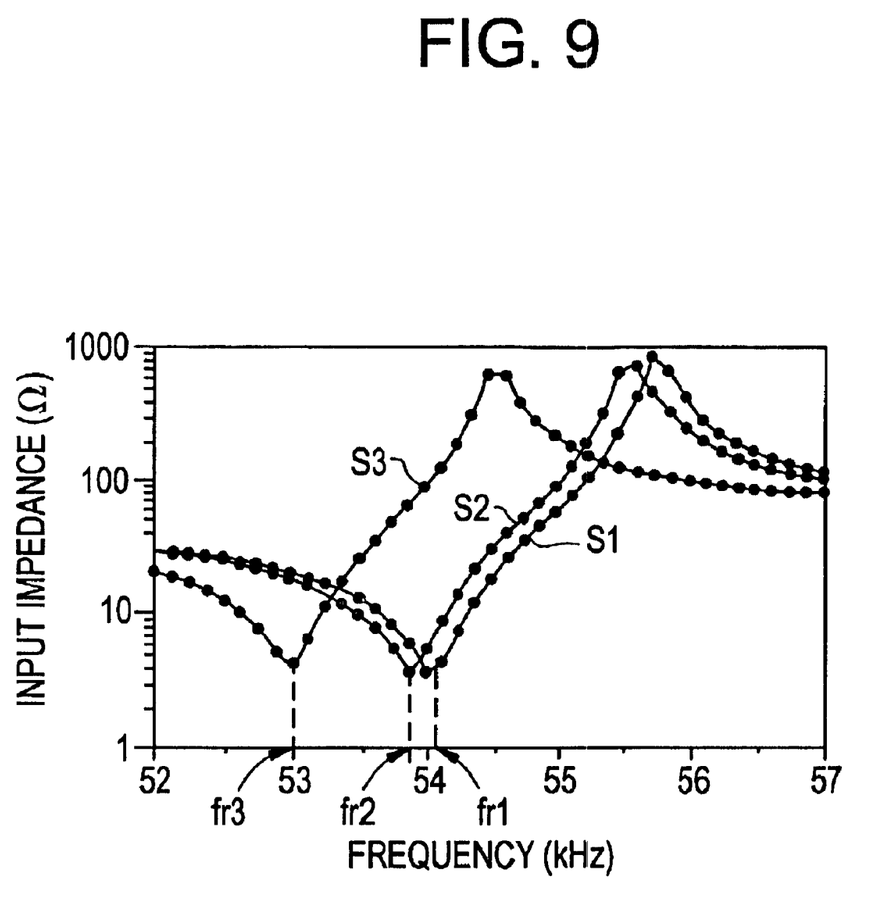
FIG. 9 is a graph indicating the input-impedance-versus-characteristic for illustrating the method for selecting the piezoelectric transformer characteristic according to the second preferred embodiment of the present invention.

FIG. 9 shows the results obtained by measuring the input-impedance-versus-frequency characteristic of each of the samples S1 to S3 using the measuring apparatus 31A. In FIG. 9, a solid line S1 indicates the measurement result of the sample S1 (the polarizability of the generating section 13: about 63%); a solid line S2 indicates the measurement result of the sample S2 (the polarizability of the generating section 13: about 83%); and a solid line S3 indicates the measurement result of the sample S3 (the polarizability of the generating section 13: about 100%).

FIG. 9 shows that the resonant frequency $f_r$ of the piezoelectric transformer 10 moves toward the higher frequency side in the order of $f_r3$, $f_r2$, and $f_r1$ in accordance with the decrease in the polarizability of the generating section 13 (in other words, as the sample is varied in the order of the samples S3, S2, and S1). Therefore, setting the upper limit of the resonant frequency $f_r$ from the input-impedance-versus-frequency characteristic enables the piezoelectric transformer 10 having a predetermined characteristic to be selected without measuring the efficiency-versus-frequency characteristic or the step-up-ratio-versus-frequency characteristic.

In the third preferred embodiment of the present invention, a method for selecting a characteristic of the piezoelectric transformer 10 is described in which the characteristic of the piezoelectric transformer 10 is selected by setting the piezoelectric transformer 10 in the frequency-characteristic measuring apparatus 31 shown in FIG. 4 and measuring a bandwidth $\Delta f$ from the input-impedance-versus-frequency characteristic of the piezoelectric transformer 10 where the bandwidth $\Delta f$=an antiresonant frequency $f_a$—the resonant frequency $f_r$.

As is shown in FIG. 4, the input external electrode 14 and the ground external electrode 15 of the piezoelectric transformer 10 are electrically connected to the measurement terminals 38a and 38b, respectively. On the other hand, the output external electrode 16 is in an open state.

A plurality of samples of the piezoelectric transformer 10, e.g. samples S4, S5, and S6, each has eight laminated ceramic green sheets, approximate dimensions of 30 mm in length, 6 mm in width, and 1.4 mm in thickness, and a ratio of about 6:4 of the length $L_t$ of the driving section 12 to the length $L_s$. of the generating section 13. While the polarizabilities of the generating units 13 of these samples are 100%, the polarizability of the driving section 12 of the sample S4 is about 80%, the polarizability of the driving section 12 of the sample S5 is about 90%, and the polarizability of the driving section 12 of the sample S6 is about 100%.

Figure 10A:
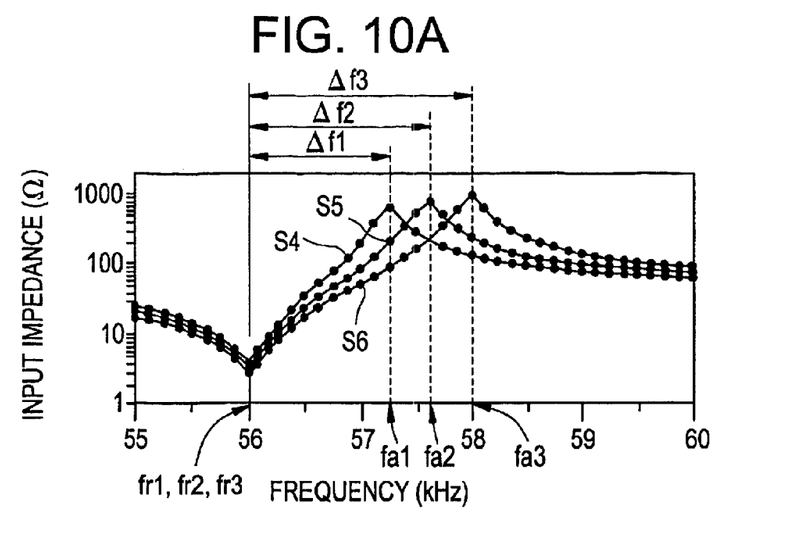
FIGS. 10A, 10B, and 10C are graphs indicating the input-impedance-versus-frequency characteristic, the efficiency-versus-frequency characteristic, and the step-up-ratio-versus-frequency characteristic, respectively, for illustrating a method for selecting the piezoelectric transformer characteristic according to a third preferred embodiment of the present invention.
Figure 10B:
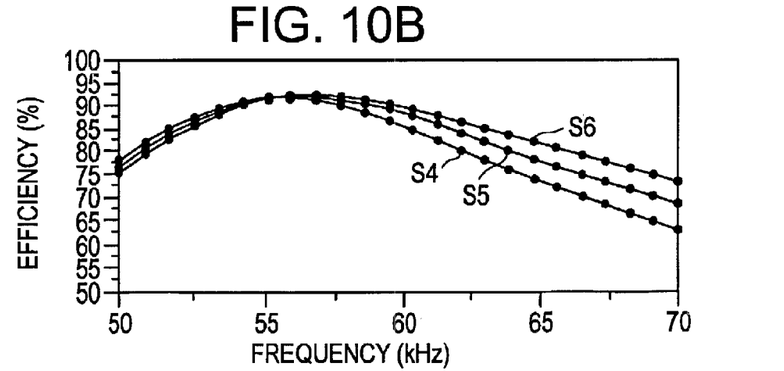
Figure 10C:
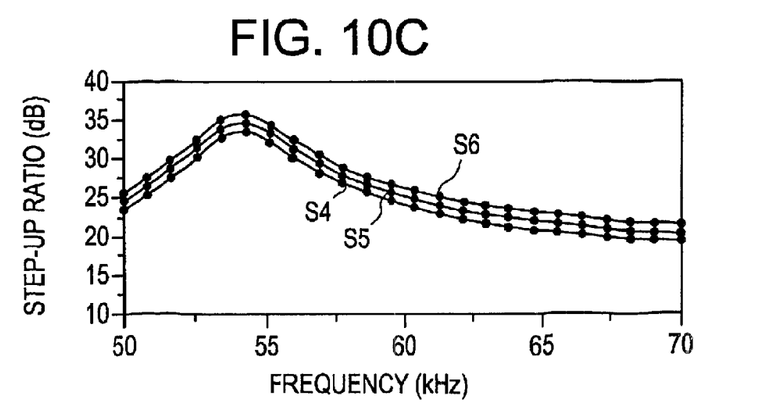

FIG. 10A indicates the results obtained by measuring the input-impedance-versus-frequency characteristics of the corresponding samples S4 to S6 using the measuring apparatus 31. FIGS. 10B and 10C indicate the results obtained by measuring, using the measuring apparatus 40 in FIG. 7, the efficiency-versus-frequency characteristic and the step-up-ratio-versus-frequency characteristic, respectively, of the corresponding samples S4 to S6. In these figures, the solid lines S4 represent the measurement results of the sample S4, the solid lines S5 represent the measurement results of the sample S5, and the solid lines S6 represent the measurement results of the sample S6.

FIG. 10A shows that the bandwidth $\Delta f$ of the piezoelectric transformer 10 in which the bandwidth $\Delta f$=the antiresonant frequency $f_a$—the resonant frequency $f_r$ decreases in the order of $\Delta f3$, $\Delta f2$, and $\Delta f1$ in accordance with the decrease in the polarizability of the primary-side driving section 12 (in other words, as the sample is varied in the order of S6, S5, and S4). FIG. 10B shows that the efficiency of the piezoelectric transformer 10 decreases in accordance with the decrease in the polarizability of the primary-side driving section 12. FIG. 10C shows that the step-up ratio of the piezoelectric transformer 10 decreases in accordance with the decrease in the polarizability of the primary-side driving section 12.

Once the above-described relationships are established, the piezoelectric transformer 10 in which desired efficiency and step-up ratio are ensured can be selected in the same manner as in the first preferred embodiment by setting the lower limit of the bandwidth Δf so as to enable the efficiency and step-up ratio that are necessary for operating at a predetermined frequency to be obtained without measuring the efficiency-versus-frequency characteristic and the step-up-ratio-versus-frequency characteristic. That is, measuring the bandwidth Δf from the input-impedance-versus-frequency characteristic enables the polarizability condition of the primary-side driving section 12 to be confirmed.

In the fourth preferred embodiment of the present invention, a method for selecting a characteristic of the piezoelectric transformer 10 is described in which the characteristic of the piezoelectric transformer 10 is selected by measuring the bandwidth Δf from the input-impedance-versus-frequency characteristic in which the bandwidth Δf=the antiresonant frequency $f_a$—the resonant frequency $f_r$ while causing the measurement terminal 38c to short-circuit the secondary-side generating section 13 (in other words, the output external electrode 16) in the frequency-characteristic measuring apparatus 31A shown in FIG. 8.

When the input-impedance-versus-frequency characteristics of the samples S4 to S6 according to the third preferred embodiment are measured using the measuring apparatus 31A, the bandwidth Δf of the piezoelectric transformer 10 decreases in accordance with the decrease in the polarizability of the driving section 12. Accordingly, setting the lower limit of the bandwidth Δf from the input-impedance-versus-frequency characteristic enables the piezoelectric transformer 10 having a predetermined characteristic to be selected without measuring the efficiency-versus-frequency characteristic and step-up-ratio-versus-frequency characteristic.

In the fifth preferred embodiment of the present invention, a method for selecting a characteristic of the piezoelectric transformer 10 is described in which the characteristic of the piezoelectric transformer 10 is selected by setting the piezoelectric transformer 10 in the frequency-characteristic measuring apparatus 31 shown in FIG. 4 and then measuring a resonant resistance $Z_r$ from the input-impedance-versus-frequency characteristic of the piezoelectric transformer 10.

As is shown in FIG. 4, the input external electrode 14 and the ground external electrode 15 of the piezoelectric transformer 10 are electrically connected to the measurement terminals 38a and 38b, respectively. On the other hand, the output external electrode 16 is in an open state.

One sample of the piezoelectric transformer 10 is provided which has eight laminated ceramic green sheets, approximate dimensions of 30 mm in length, 6 mm in width, and 1.4 mm in thickness, and a ratio of about 6:4 of the length $L_t$ of the driving section 12 to the length $L_s$ of the generating section 13. The resistances of the internal electrodes 21 and 22 of the driving section 12 increase as the film thickness of each of the internal electrodes 21 and 22 becomes thinner. In view of this fact, when a chip resistor is connected in series with the primary-side driving section 12 (in other words, the input external electrode 14) of the piezoelectric transformer 10, the resistance of this chip resistor is assumed to be the increase in the resistances of the internal electrodes 21 and 22 due to thinning of film thickness of each of the internal electrodes 21 and 22. That is, instead of providing a plurality of samples having the thin-film internal electrodes 21 and 22, that which is obtained by measuring the provided sample without connecting to any chip resistor is used as a sample S7; that which is obtained by measuring the provided sample connected to a chip resistor of about 1.0Ω is used as a sample S8; and that which is obtained by measuring the provided sample connected to a chip resistor of about 2.0Ω is used as a sample S9.

Figure 11A:
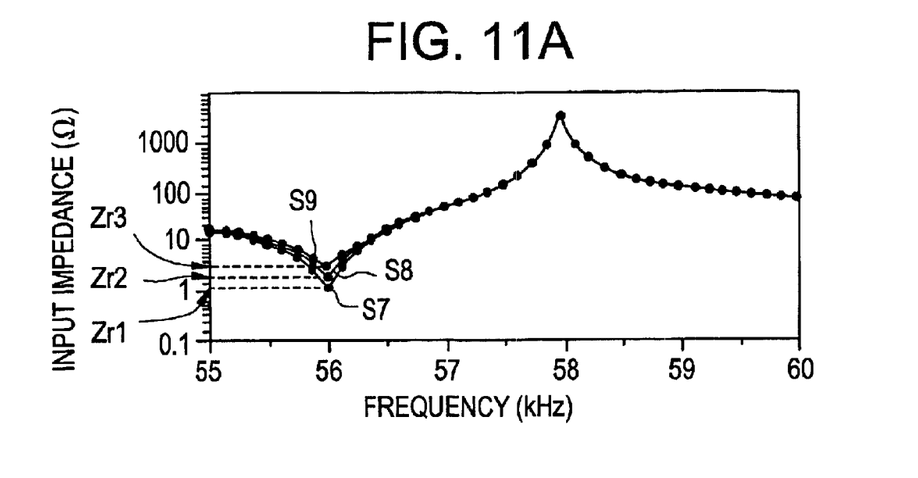
FIGS. 11A, 11B, and 11C are graphs indicating the input-impedance-versus-frequency characteristic, the efficiency-versus-frequency characteristic, and the step-up-ratio-versus-frequency characteristic, respectively, for illustrating a method for selecting the piezoelectric transformer characteristic according to a fifth preferred embodiment of the present invention.
Figure 11B:
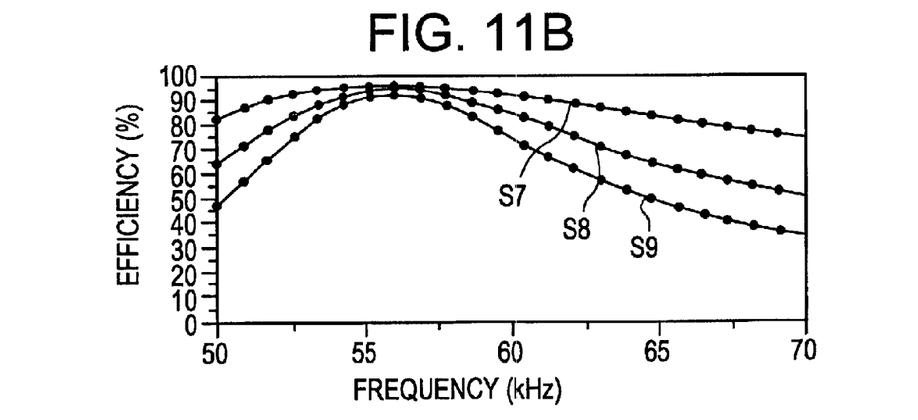
Figure 11C:
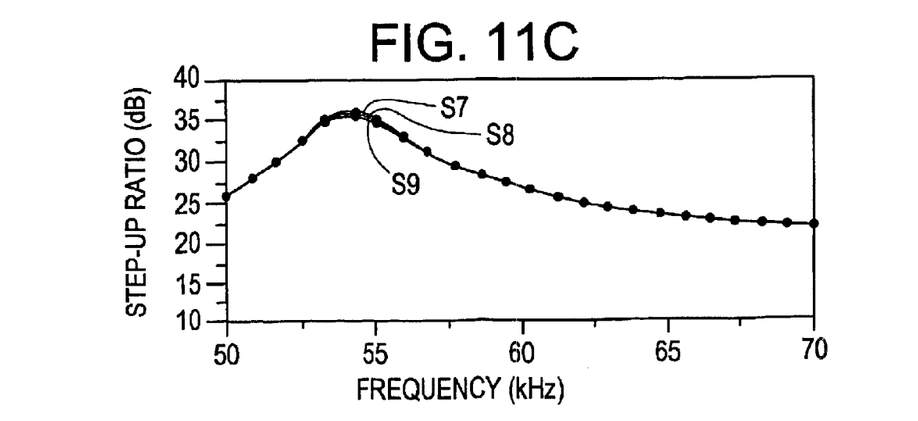

FIG. 11A indicates the results obtained by measuring the input-impedance-versus-frequency characteristics of the corresponding samples S7 to S9 using the measuring apparatus 31. FIGS. 11B and 11C indicate the results obtained by measuring, using the measuring apparatus 40 in FIG. 7, the efficiency-versus-frequency characteristics and the step-up-ratio-versus-frequency characteristics, respectively, of the corresponding samples S7 to S9. In these figures, the solid lines S7 represent the measurement results of the sample S7; the solid lines S8 represent the measurement results of the sample S8; and the solid lines S9 represent the measurement results of the sample S9.

FIG. 11A shows that as the attached resistance increases in the order of the samples S7, S8, and S9 (in other words, as the thickness of each of the internal electrodes 21 and 22 of the primary-side driving section 12 decreases in the above order), the resonant resistance $Z_r$ of the piezoelectric transformer 10 increases in the order of $Z_r1$, $Z_r2$, and $Z_r3$. FIG. 11B shows that as the film thickness of each of the internal electrodes 21 and 22 becomes thinner, the efficiency of the piezoelectric transformer 10 decreases. FIG. 11C shows that, with respect to the samples S7 to S9, as the film thickness of each of the internal electrodes 21 and 22 becomes thinner, the step-up ratio increases in the proximity of the corresponding resonant frequencies while decreasing away from the frequencies.

Once the above relationships are established, the piezoelectric transformer 10 in which desired efficiency and step-up ratio are ensured can be selected in the same manner as in the first preferred embodiment by setting the upper limit of the resonant resistance $Z_r$ so as to enable the efficiency and step-up ratio that are necessary for operating at a predetermined frequency to be obtained without measuring the efficiency-versus-frequency characteristic and the step-up-ratio-versus-frequency characteristic. That is, measuring the resonant resistance $Z_r$ from the input-impedance-versus-frequency characteristic enables the film thickness conditions of the internal electrodes 21 and 22 of the primary-side driving section 12 to be confirmed.

In the sixth preferred embodiment of the present invention, a method for selecting a characteristic of the piezoelectric transformer 10 is described in which the characteristic of the piezoelectric transformer 10 is selected by measuring the resonant resistance $Z_r$ from the input-impedance-versus-frequency characteristic while causing the measurement terminal 38c to short-circuit the secondary-side generating section 13 (in other words, the output external electrode 16) in the frequency-characteristic measuring apparatus 31A shown in FIG. 8.

When the input-impedance-versus-frequency characteristics of the samples S7 to S9 according to the fifth preferred embodiment are measured using the measuring apparatus 31A, as the corresponding attached resistances become greater (in other words, as the film thickness of each of the internal electrodes 21 and 22 of the primary-side driving section 12 becomes thinner), the resonant resistance $Z_r$ of the piezoelectric transformer 10 becomes greater. Accordingly, setting the upper limit of the resonant resistance $Z_r$ from the input-impedance-versus-frequency characteristic enables the piezoelectric transformer 10 having a predetermined characteristic to be selected without measuring the efficiency-versus-frequency characteristic and step-up-ratio-versus-frequency characteristic.

The present invention is not restricted to the above-described preferred embodiments. Various modifications may be made within the spirit and the scope of the present invention. For example, the resonant frequency $f_r$, the bandwidth $\Delta f$, and the resonant resistance $Z_r$ from the input-impedance-versus-frequency characteristic of the piezoelectric transformer 10 are individually measured in the foregoing preferred embodiments. By measuring an arbitrary combination of these measurement factors $f_r$, $\Delta f$, and $Z_r$, the piezoelectric transformer having a predetermined characteristic may be selected. Particularly, by measuring all of the resonant frequency $f_r$, the bandwidth $\Delta f$, and the resonant resistance $Z_r$, the polarizability conditions of the primary-side driving section 12 and the secondary-side generating section 13 and the internal electrode film thickness condition of the primary-side driving section 12 can be confirmed. Therefore, more accurate selection for the piezoelectric transformer characteristic can be performed.

While the present invention has particularly shown and described with reference to the preferred embodiments thereof, it will be understood by those skilled in the art that the foregoing and other changes in form and details can be made therein without departing from the spirit and scope of the invention.

What is claimed is:

1. A method for selecting a piezoelectric transformer having a desired characteristic which is performed in a method of manufacturing a piezoelectric transformer, comprising the steps of:
    connecting a primary-side driving section of a piezoelectric transformer to a high-frequency generator while leaving a secondary-side generating section thereof in an open state;
    causing said high-frequency generator to sequentially generate and sweep a high-frequency signal over a predetermined frequency range;
    measuring a resonant frequency of an input-impedance-versus-frequency characteristic of the piezoelectric transformer;
    selecting the piezoelectric transformer if said piezoelectric transformer has a desired characteristic based on the value of the measured resonant frequency;
    rejecting the piezoelectric transformer if the piezoelectric transformer does not have a desired characteristic based on the value of the measured resonant frequency; and
    completing the manufacturing of the piezoelectric transformer after the steps of selecting and rejecting.

2. The method according to claim 1, wherein the step of measuring the piezoelectric transformer is done while the piezoelectric transformer is in an isolated state in which the piezoelectric transformer is not mounted on a mounting substrate.

3. The method according to claim 1, wherein only the input-impedance-versus-frequency characteristic of the piezoelectric transformer is measured.

4. A method for selecting a piezoelectric transformer having a desired characteristic which is performed in a method of manufacturing a piezoelectric transformer, comprising the steps of:
    connecting a primary-side driving section of a piezoelectric transformer to a high-frequency generator while leaving a secondary-side generating section thereof in an open state;
    causing said high-frequency generator to sequentially generate and sweep a high-frequency signal over a predetermined frequency range;
    measuring a bandwidth of an input-impedance-versus-frequency characteristic of the piezoelectric transformer by subtracting a resonant-frequency fr from an antiresonant-frequency fa;
    selecting the piezoelectric transformer if the piezoelectric transformer has a desired characteristic based on the value of the measured bandwidth;
    rejecting the piezoelectric transformer if the piezoelectric transformer does not have a desired characteristic based on the value of the measured bandwidth; and
    completing the manufacturing of the piezoelectric transformer after the steps of selecting and rejecting.

5. The method according to claim 4, wherein the step of measuring the piezoelectric transformer is done while the piezoelectric transformer is in an isolated state in which the piezoelectric transformer is not mounted on a mounting substrate.

6. The method according to claim 4, wherein only the input-impedance versus-frequency characteristic of the piezoelectric transformer is measured.

7. A method for selecting a piezoelectric transformer having a desired characteristic which is performed in a method of manufacturing a piezoelectric transformer, comprising the steps of:
    connecting a primary-side driving section of a piezoelectric transformer to a high-frequency generator while leaving a secondary-side generating section thereof in an open state;
    causing said high-frequency generator to sequentially generate and sweep a high-frequency signal over a predetermined frequency range;
    measuring a resonant resistance from an input-impedance-versus-frequency characteristic of the piezoelectric transformer
    selecting the piezoelectric transformer if the piezoelectric transformer has a desired characteristic based on the value of the measured resonant resistance;
    rejecting the piezoelectric transformer if the piezoelectric transformer does not have a desired characteristic based on the value of the measured resonant resistance; and
    completing the manufacturing of the piezoelectric transformer after the steps of selecting and rejecting.

8. The method according to claim 7, wherein the step of measuring the piezoelectric transformer is done while the piezoelectric transformer is in an isolated state in which the piezoelectric transformer is not mounted on a mounting substrate.

9. The method according to claim 7, wherein only the input-impedance-versus-frequency characteristic of the piezoelectric transformer is measured.

10. A method for selecting a piezoelectric transformer having a desired characteristic which is performed in a method of manufacturing a piezoelectric transformer, comprising the steps of:
    connecting a primary-side driving section of a piezoelectric transformer to a high-frequency generator while leaving a secondary-side generating section thereof in an open state;
    causing said high-frequency generator to sequentially generate and sweep a high-frequency signal over a predetermined frequency range;
    measuring a resonant frequency, a bandwidth, and a resonant resistance from an input-impedance-versusfrequency characteristic of the piezoelectric transformer in which the bandwidth is determined by subtracting a resonant-frequency fr from an antiresonant-frequency fa:

selecting the piezoelectric transformer if the piezoelectric transformer has a desired characteristic based on the values of the measured resonant frequency, the bandwidth, and the resonant resistance;

rejecting the piezoelectric transformer if the piezoelectric transformer does not have a desired characteristic based on the values of the measured resonant frequency, the bandwidth, and the resonant resistance; and completing the manufacturing of the piezoelectric transformer after the steps of selecting and rejecting.

11. The method according to claim 10, wherein the step of measuring the piezoelectric transformer is done while the piezoelectric transformer is in an isolated state in which the piezoelectric transformer is not mounted on a mounting substrate.

12. The method according to claim 10, wherein only the input-impedance-versus-frequency characteristic of the piezoelectric transformer is measured.

13. A method for selecting a piezoelectric transformer having a desired characteristic which is performed in a method of manufacturing a piezoelectric transformer, comprising the steps of:

connecting a primary-side driving section of a piezoelectric transformer to a high-frequency generator while leaving a secondary-side generating section thereof short-circuited;

causing said high-frequency generator to sequentially generate and sweep a high-frequency signal over a predetermined frequency range;

measuring a resonant frequency of an input-impedance-versus-frequency characteristic of the piezoelectric transformer selecting the piezoelectric transformer if the piezoelectric transformer has a desired characteristic based on the value of the measured resonant frequency;

rejecting the piezoelectric transformer if the piezoelectric transformer does not have a desired characteristic based on the value of the measured resonant frequency; and completing the manufacturing of the piezoelectric transformer after the steps of selecting and rejecting.

14. The method according to claim 13, wherein the step of measuring the piezoelectric transformer is done while the piezoelectric transformer is in an isolated state in which the piezoelectric transformer is not mounted on a mounting substrate.

15. The method according to claim 13, wherein only the input-impedance-versus-frequency characteristic of the piezoelectric transformer is measured.

16. A method for selecting a piezoelectric transformer having a desired characteristic which is performed in a method of manufacturing a piezoelectric transformer, comprising the steps of:

connecting a primary-side driving section of a piezoelectric transformer to a high-frequency generator while leaving a secondary-side generating section thereof short-circuited;

causing said high-frequency generator to sequentially generate and sweep a high-frequency signal over a predetermined frequency range;

measuring a bandwidth of an input-impedance-versus-frequency characteristic of the piezoelectric transformer by subtracting a resonant-frequency from an antiresonant-frequency;

selecting the piezoelectric transformer if the piezoelectric transformer has a desired characteristic based on the value of the measured bandwidth;

rejecting the piezoelectric transformer if the piezoelectric transformer does not have a desired characteristic based on the value of the measured bandwidth; and completing the manufacturing of the piezoelectric transformer after the steps of selecting and rejecting.

17. The method according to claim 16, wherein the step of measuring the piezoelectric transformer is done while the piezoelectric transformer is in an isolated state in which the piezoelectric transformer is not mounted on a mounting substrate.

18. The method according to claim 16, wherein only the input-impedance-versus-frequency characteristic of the piezoelectric transformer is measured.

19. A method for selecting a piezoelectric transformer having a desired characteristic which is performed in a method of manufacturing a piezoelectric transformer, comprising the steps of:

connecting a primary-side driving section of a piezoelectric transformer to a high-frequency generator while leaving secondary-side generating section thereof short-circuited;

causing said high-frequency generator to sequentially generate and sweep a high-frequency signal over a predetermined frequency range;

measuring a resonant resistance of an input-impedance-versus-frequency-characteristic of the piezoelectric transformer;

selecting the piezoelectric transformer if the piezoelectric transformer has a desired characteristic based on the value of the measured resonant resistance;

rejecting the piezoelectric transformer if the piezoelectric transformer does not have a desired characteristic based on the value of the measured resonant resistance; and completing the manufacturing of the piezoelectric transformer after the steps of selecting and rejecting.

20. The method according to claim 19, wherein the step of measuring the piezoelectric transformer is done while the piezoelectric transformer is in an isolated state in which the piezoelectric transformer is not mounted on a mounting substrate.

21. The method according to claim 19, wherein only the input-impedance-versus-frequency characteristic of the piezoelectric transformer is measured.

22. A method for selecting a piezoelectric transformer having a desired characteristic which is performed in a method of manufacturing a piezoelectric transformer, comprising the steps of:

connecting a primary-side driving section of a piezoelectric transformer to a high-frequency generator while leaving a secondary-side generating section thereof short-circuited;

causing said high-frequency generator to sequentially generate and sweep a high-frequency signal over a predetermined frequency range;

measuring a resonant frequency, a bandwidth, and a resonant resistance of an input-impedance-versus-frequency characteristic of the piezoelectric transformer in which the bandwidth is determined by subtracting a resonant-frequency from an antiresonant-frequency, selecting the piezoelectric transformer if the piezoelectric transformer has a desired characteristic based on the values of the measured resonant frequency, the bandwidth, and the resonant resistance;

rejecting the piezoelectric transformer if the piezoelectric transformer does not have a desired characteristic based on the measured resonant frequency, the bandwidth, and the resonant resistance; and completing the manufacturing of the piezoelectric transformer after the steps of selecting and rejecting.

23. The method according to claim 22, wherein the step of measuring the piezoelectric transformer is done while the piezoelectric transformer is in an isolated state in which the piezoelectric transformer is not mounted on a mounting substrate.

24. The method according to claim 22, wherein only the input-impedance-versus-frequency characteristic of the piezoelectric transformer is measured.

* * * * *